United States Patent
Zhou et al.

(10) Patent No.: US 11,083,094 B2
(45) Date of Patent: Aug. 3, 2021

(54) FLEXIBLE DISPLAY DEVICE

(71) Applicant: BOE TECHNOLOGY GROUP CO., LTD., Beijing (CN)

(72) Inventors: Yonghong Zhou, Beijing (CN); Shiming Shi, Beijing (CN); Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 16/633,360

(22) PCT Filed: Jul. 23, 2019

(86) PCT No.: PCT/CN2019/097275
§ 371 (c)(1),
(2) Date: Jan. 23, 2020

(87) PCT Pub. No.: WO2020/024849
PCT Pub. Date: Feb. 6, 2020

(65) Prior Publication Data
US 2021/0084778 A1    Mar. 18, 2021

(30) Foreign Application Priority Data
Aug. 2, 2018  (CN) .......................... 201810870729.2

(51) Int. Cl.
*H05K 5/00*    (2006.01)
(52) U.S. Cl.
CPC .................................. *H05K 5/0017* (2013.01)

(58) Field of Classification Search
None
See application file for complete search history.

(56) References Cited

U.S. PATENT DOCUMENTS 5,436,744 A * 7/1995 Arledge .............. G02F 1/13452
                                                349/150
5,442,470 A    8/1995 Hashimoto
(Continued)

FOREIGN PATENT DOCUMENTS

CN    105009188 A    10/2015
CN    107464878 A    12/2017
(Continued)

OTHER PUBLICATIONS

The First Office Action with Search Report dated Aug. 5, 2019 corresponding to Chinese application No. 201810870729.2.
(Continued)

*Primary Examiner* — Xanthia C Cunningham
(74) *Attorney, Agent, or Firm* — Nath, Goldberg & Meyer; Joshua B. Goldberg

(57) ABSTRACT

Provided is a flexible display device, including a flexible display panel and a support structure, the flexible display panel includes a main structure region, a bending region and an extension region, the bending region is bent to locate the extension region at a back of the main structure region, an accommodation space is formed between the main structure region, the extension region and the bending region, at least part of the support structure is located in the accommodation space, and one end of the support structure extends into a bending space surrounded by the bending region.

20 Claims, 2 Drawing Sheets

(56) References Cited

U.S. PATENT DOCUMENTS

| | | | | |
|---|---|---|---|---|
| 7,563,645 | B2* | 7/2009 | Jaeck | H01L 23/5387 |
| | | | | 257/686 |
| 10,306,766 | B2* | 5/2019 | Shi | H01L 51/0097 |
| 10,888,017 | B2* | 1/2021 | Wang | H05K 5/0213 |
| 2001/0033009 | A1* | 10/2001 | Inoue | H05K 7/20963 |
| | | | | 257/668 |
| 2013/0100392 | A1* | 4/2013 | Fukushima | G02F 1/1333 |
| | | | | 349/150 |
| 2014/0217382 | A1* | 8/2014 | Kwon | H01L 51/5246 |
| | | | | 257/40 |
| 2014/0307396 | A1* | 10/2014 | Lee | H05K 1/028 |
| | | | | 361/749 |
| 2015/0021570 | A1* | 1/2015 | Kim | H01L 51/5293 |
| | | | | 257/40 |
| 2015/0036300 | A1* | 2/2015 | Park | G02F 1/1345 |
| | | | | 361/749 |
| 2015/0257290 | A1* | 9/2015 | Lee | H05K 5/0021 |
| | | | | 361/749 |
| 2016/0181345 | A1* | 6/2016 | Lee | H01L 51/0097 |
| | | | | 257/40 |
| 2017/0215288 | A1* | 7/2017 | Shi | H01L 27/3276 |
| 2018/0102072 | A1* | 4/2018 | Lee | G06F 3/147 |
| 2018/0184530 | A1* | 6/2018 | Wang | G02F 1/13452 |

FOREIGN PATENT DOCUMENTS

| | | |
|---|---|---|
| CN | 107611161 A | 1/2018 |
| CN | 207650511 U | 7/2018 |
| CN | 108962035 A | 12/2018 |

OTHER PUBLICATIONS

The Second Office Action with Search Report dated May 9, 2020 corresponding to Chinese application No. 201810870729.2.

* cited by examiner

FLEXIBLE DISPLAY DEVICE

CROSS REFERENCE TO RELATED APPLICATIONS

This is a National Phase Application filed under 35 U.S.C. 371 as a national stage of PCT/CN2019/097275, filed on Jul. 23, 2019, an application claiming priority to Chinese patent application No. 201810870729.2, filed on Aug. 2, 2018, the entire contents of each of which are incorporated herein by reference.

TECHNICAL FIELD

The present disclosure relates to the field of display technology, and in particular to a flexible display device.

BACKGROUND

A cover plate of a flexible display panel is very thin and can only bear a small pressing force while being used by a user. As for the structure of the flexible display panel, a bending region structure is usually provided in an edge area of a screen, a part of the structure of the flexible display panel can be bent to the back of the screen through the bending region, and a housing of the flexible display panel needs to keep an empty space in the bending region, so that an accommodation space is formed.

SUMMARY

The present disclosure provides a flexible display device, including a flexible display panel and a support structure, wherein the flexible display panel includes a main structure region, a bending region and an extension region, the bending region is bent to locate the extension region at a back of the main structure region, an accommodation space is formed between the main structure region, the extension region and the bending region, at least part of the support structure is located in the accommodation space, and one end of the support structure extends into a bending space surrounded by the bending region.

In some embodiments, the support structure is a plate-like structure.

In some embodiments, the end of the support structure extending into the bending space has a round corner structure.

In some embodiments, the support structure is a folded two-layer metal plate, a folded region of two layers of metal plate of the folded two-layer metal plate forms a round corner close to the bending region of the flexible display panel, a welding seam is formed between the two layers of the metal plate, and one layer of metal plate close to the main structure region of the flexible display panel extends away from the bending region and beyond the other layer of metal plate close to the extension region of the flexible display panel.

In some embodiments, a protruding support structure is integrally provided at the end of the support structure close to the bending region as a single piece, the protruding support structure is located in the bending space surrounded by the bending region and protrudes toward the main structure region, and a gap is formed between the protruding support structure and the bending region.

In some embodiments, a filling structure is disposed in the gap, and a material of the filling structure is rubber.

In some embodiments, the support structure is connected with the main structure region of the flexible display panel with an adhesive, and is connected with the extension region of the flexible display panel with an adhesive.

In some embodiments, the adhesive is a double-sided tape.

In some embodiments, the display device further includes a first housing keeping an empty space in the extension region and the bending region, and the one layer of metal plate of the support structure close to the main structure region of the flexible display panel extends away from the bending region and beyond the other layer of metal plate close to the extension region of the flexible display panel, and the part of the one layer of metal plate, which is beyond the other layer of the metal plate, extends to the first housing and is overlapped with the first housing.

In some embodiments, the display device includes a first housing keeping an empty space in the extension region and the bending region, one end of the support structure away from the bending region is provided with a first overlapping structure, one end of the first housing close to the support structure is provided with a second overlapping structure matched with the first overlapping structure, and the first overlapping structure and the second overlapping structure are overlapped along a direction perpendicular to the flexible display panel.

In some embodiments, the first overlapping structure is integrated with the support structure as a single piece, the second overlapping structure is integrated with the first housing as single piece, both the first and second overlapping structures have reduced thicknesses in a direction perpendicular to the flexible display panel, an upper surface of the first overlapping structure facing the main structure region of the flexible display panel is flush with an upper surface of the support structure facing the main structure region of the flexible display panel and an upper surface of the first housing facing the main structure region of the flexible display panel, and a lower surface of the second overlapping structure away from the main structure region of the flexible display panel is flush with a lower surface of the extension region of the flexible display panel away from the support structure.

In some embodiments, the flexible display device further includes a touch module, a cover plate, and a second housing, wherein the touch module is located on a side of the main structure region of the flexible display panel away from the extension region, the second housing includes a side structure and a main structure, the side structure is located on an outer side of the flexible display panel, the main structure is located on one side of the flexible display panel close to the extension region and surrounds the first housing, the cover plate is located on one side of the touch module away from the main structure region, and an outer side of the cover plate is located above the side structure of the second housing.

In some embodiments, the flexible display device further includes a protruding structure of cover plate located on an edge of the cover plate close to the side structure, wherein one end of the protruding structure of cover plate is located at a position which keeps a distance of 0.3 mm to 1 mm from an effective display area of the flexible display panel towards the edge of the cover plate, and the other end of the protruding structure of cover plate is located on the outer side of the cover plate above the side structure of the second housing.

In some embodiments, the flexible display device further includes an external circuit located between the extension region and the main structure of the second housing.

In some embodiments, the external circuit includes a flexible printed circuit board disposed in the extension region and extending to one side of the first housing close to the second housing.

In some embodiments, the flexible display device further includes a buffer layer located between the main structure region and the support structure and between the main structure region and the first housing.

DETAILED DESCRIPTION

In order to enable those skilled in the art to better understand the technical solutions of the present disclosure, the flexible display device provided in the present disclosure will be described in detail below with reference to the accompanying drawings.

Figure 7:
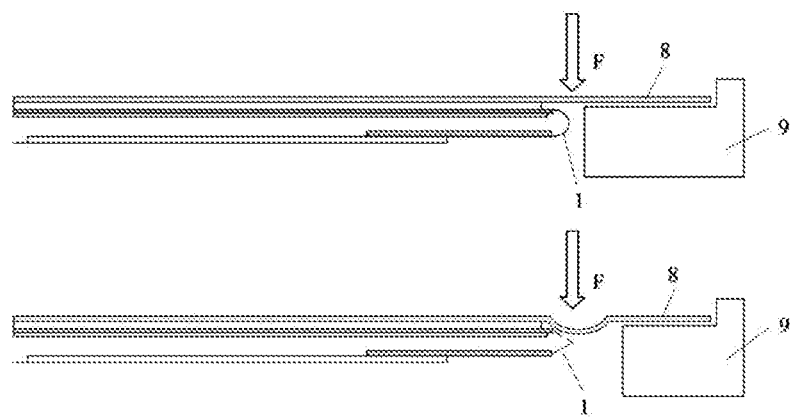
FIG. 7 is a schematic structural view of a flexible display device according to the related art.

Referring to FIG. 7, a bending region of a screen is very likely to be damaged due to frequently pressing at a display edge region of a flexible display panel 8, which will result in a short service lifetime of a flexible display device. In FIG. 7, F indicates a pressing force, and the arrow indicates a pressing direction.

Due to the accommodation space in the related art, the cover plate will be excessively depressed during the pressing process, thereby damaging the bending region.

Figure 1:
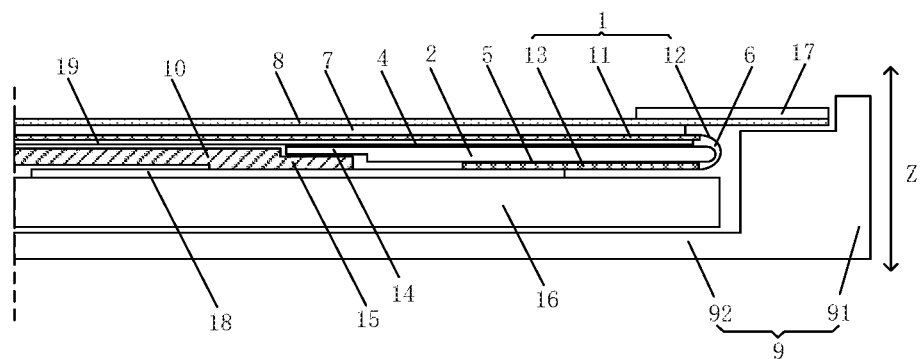
FIG. 1 is a cross-sectional view of a flexible display device according to an embodiment of the present disclosure.
Figure 2:
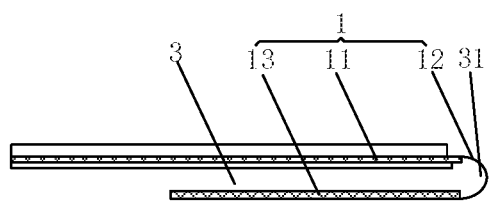
FIG. 2 is a schematic view of an accommodation space of FIG. 1.

FIG. 1 is a cross-sectional view of a flexible display device according to an embodiment of the present disclosure, which is a half of a cross-sectional view taken from a display surface along a direction perpendicular to a bending region in the view when the display device is laid flat. FIG. 2 is a cross-sectional view of some structures of the display device of FIG. 1. As shown in FIGS. 1 and 2, the flexible display device includes a flexible display panel 1 and a support structure 2, the flexible display panel 1 includes a main structure region 11, a bending region 12 and an extension region 13, and the bending region 12 is configured to bend to locate the extension region 13 at a back of the main structure region 11, a space between the main structure region 11, the extension region 13 and the bending region 12 forms an accommodation space 3, and the support structure 2 is partially or completely located in the accommodation space 3. One end of the support structure 2 extends beyond a display region edge of the main structure region 11 and extends into a bending space 31 surrounded by the bending region 12.

The main structure region 11 of the flexible display panel 1 is a display region provided with pixel structures for displaying an image, and the bending region 12 and the extension region 13 forms a peripheral region other than the display region, the peripheral region is provided with a circuit structure (also referred to as an external circuit), and an example of the peripheral region is provided with a circuit structure such as a lead wire and a circuit board. In some embodiments, the circuit board is a Chip On Film (COF) or a Chip On Panel (COP).

Figure 3:
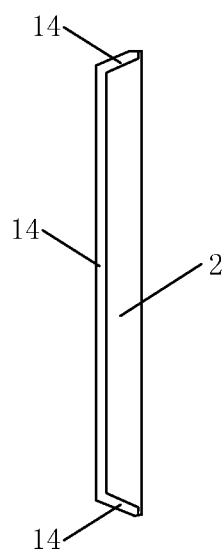
FIG. 3 is a schematic structural view of a support structure of a flexible display device according to an embodiment.

FIG. 3 is a schematic structural view of a support structure of a flexible display device according to an embodiment. As shown in FIG. 3, in one embodiment, the support structure 2 is a laminated thin plate structure. An upper layer of the two-layer structure in FIG. 3 is shorter, while a lower layer thereof is longer, and an extension part of the lower layer (that is, a first overlapping structure 14 described below) is given a reference numeral of 14 in FIG. 3. In another embodiment, the support structure 2 is a plate-like structure.

Illustratively, a material of the support structure 2 includes Plastic (PC), nylon+glass fiber (PA+GF), stainless steel (SUS), aluminum alloy, copper alloy, Rubber (Rubber), foam, etc.

In some of the above embodiments, the end of the support structure extending into the bending space has a round corner structure, that is, the end of the support structure 2 close to the bending region 12 is round.

In some embodiments, the flexible display device further includes a first connection structure 4 and a second connection structure 5, the support structure 2 is connected with the main structure region 11 of the flexible display panel 1 by the first connection structure 4, and the support structure 2 is connected with the extension region 13 of the flexible display panel 1 by the second connection structure 5. The first connection structure 4 is disposed on an entire surface of a side of the support structure 2 close to the main structure region 11 of the flexible display panel 1, and the second connection structure 5 is disposed on an entire surface of a side of the support structure 2 close to the extension region 13 of the flexible display panel 1. Illustratively, the first connection structure 4 and the second connection structure 5 each are adhesive, for example, a double-sided tape.

In some embodiments, a gap 6 is provided between the support structure 2 and the bending region 12 so as to prevent the bending region 12 from being pulled by the support structure 2 to deform or be damaged.

In some embodiments, the flexible display device further includes a touch module 7. The touch module 7 is located on a front surface of the main structure region 11 of the flexible display panel 1, that is, on a display surface of the flexible display panel 1 or a light emitting side of the display device, and the touch module 7 is located in the main structure region 11 of the flexible display panel 1. The front surface of the main structure region 11 is on a side of the main structure region 11 away from the extension region 13, and the back of the main structure region 11 is on a side of the main structure region 11 close to the extension region 13. In some embodiments, the touch module 7 is attached to the main structure region 11 with an optical adhesive. Illustratively, the touch module 7 may be attached to the main structure region 11 snugly. Illustratively, the touch module 7 is a touch panel.

In some embodiments, the flexible display device further includes a cover plate 8 and a second housing 9, and the second housing 9 wraps a non-display side of the flexible display panel 1 and includes an end face of a flexible display screen and a back face opposite to a light emitting face of the flexible display panel. The second housing 9 includes a side structure 91 and a main structure 92, and the side structure 91 wraps a side of the flexible display panel 1, and the main structure 92 is located at a back of the flexible display panel 1. The cover plate 8 is located on a side of the touch module 7 away from the main structure region 11. The cover plate 8 includes a part above the touch module 7, and further includes an extending portion which extends outwards and is located above the side structure 91. For an example, the cover plate 8 is connected to the touch module 7 with an optical adhesive.

Illustratively, the support structure 2 support the main structure region 11 and the bending region 12 of the flexible display panel 1 above an extension region in the accommodation space 3. When the cover plate 8 above the bending region 12 is depressed during a pressing process, the support structure 2 reduces damage to the bending region.

In some embodiments, a first housing 10 is disposed on the back of the main structure region 11, and is located at an end of the support structure 2 away from the bending region 12. The first housing 10 and the second housing 9 are connected together to support the flexible display device and protect the flexible display panel 1. The end of the support structure 2 away from the bending region 12 is provided with a first overlapping structure 14, one end of the first housing 10, which is close to the support structure 2, is provided with a second overlapping structure 15 which is matched with the first overlapping structure 14, and the first overlapping structure 14 and the second overlapping structure 15 are overlapped. The first overlapping structure 14 is an extension part of the support structure 2 towards the first housing 10, and the first overlapping structure 14 is integrated with the support structure 2 as a single piece, upper surfaces of the first overlapping structure 14 and the support structure 2, which face the flexible display panel 1, are flush with each other, and the first overlapping structure 1 has a reduced thickness in a direction perpendicular to the flexible display panel 1. The second overlapping structure 15 is an extension part of the first housing 10 towards the support structure 2, and has a reduced thickness in a direction perpendicular to the flexible display panel 1. A lower surface of the second overlapping structure 15 away from the main structure region 11 is flush with a lower surface of the extension region 13 of the flexible display panel 1 away from the support structure 2. The first overlapping structure 14 and the second overlapping structure 15 are arranged along a direction perpendicular to the flexible display panel 1, and the first overlapping structure 14 covers the second overlapping structure 15. Illustratively, the first overlapping structure 14 and the second overlapping structure 15 fill each other, and an upper surface of the support structure 2 is flush with an upper surface of the first housing 10, so as to firmly support the flexible display panel 1 as a whole.

Furthermore, the first overlapping structure 14 and the second overlapping structure 15 are fixedly connected with an adhesive, so as to fixedly connect the support structure 2 with the first housing 10. Illustratively, the adhesive may be a double-sided tape, or glue.

FIG. 3 is a schematic structural view of a support structure of a flexible display device according to an embodiment. As shown in FIG. 3, the support structure 2 is a laminated thin plate structure, one side thereof close to the bending region 12 is formed into a round corner structure, and the other side thereof opposite to the round corner structure is formed into the first overlapping structure 14. The first overlapping structure has a reduced thickness, and a surface thereof connected to the main structure region 11 of the flexible display panel 1 is formed as a plane. Illustratively, the side of the support structure 2 opposite to the round corner structure thereof is matched with the first housing 10 to achieve a fixed connection, thereby ensuring that the flexible display panel 1 is provided with a stable support in a Z-direction perpendicular to the flexible display panel 1.

Figure 4:
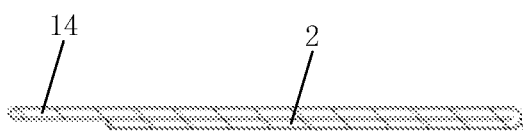
FIG. 4 is a schematic structural view of a metal support structure of a flexible display device according to an embodiment of the present disclosure.

FIGS. 3 and 4 each are a schematic structural view of a metal support structure of a flexible display device according to some embodiments. In the embodiments, the support structure 2 is a folded two-layer metal plate, a folded region of the two-layer metal plate forms a round corner close to the bending region of the flexible display panel 1, a welding seam is formed between the two layers of the metal plate, and the layer of the metal plate close to the main structure region 11 of the flexible display panel 1 extends away from the bending region and beyond the other layer of the metal plate close to the extension region 13 of the flexible display panel, so as to form the first overlapping structure 14. As shown in FIG. 4, in a case that the support structure 2 is made of metal, which is, for example, stainless steel, aluminum, aluminum alloy, copper, or copper alloy, a plate-like structure is formed by a stamping process, and then is folded, and opposite inner surfaces of the folded plate-like structure are welded to form the support structure 2 having the first overlapping structure 14. The end of the support structure 2 away from the first overlapping structure 14 is formed into a round corner structure so as to avoid scratching the bending region 12 to the greatest extent. When the support structure 2 is made of metal, the support structure 2 also plays a role in conducting heat to conduct heat of the flexible display panel out to the external environment.

In some embodiments, the flexible display device further includes an external circuit 16 independent of the display panel. The external circuit 16 is located between the extension region 13 and the main structure 92 of the second housing 9. Illustratively, the external circuit 16 includes a battery and/or a motherboard assembly.

In some embodiments, the flexible display device further includes a flexible printed circuit board (FPC) 18. The flexible printed circuit board 18 is disposed under the first housing 10 and extends to the lower surface of the extension region 13. The flexible printed circuit board 18 is located between the extension region 13 and the main structure 92, and specifically, the flexible printed circuit board 18 is located between the extension region 13 and the external circuit 16.

Figure 5:
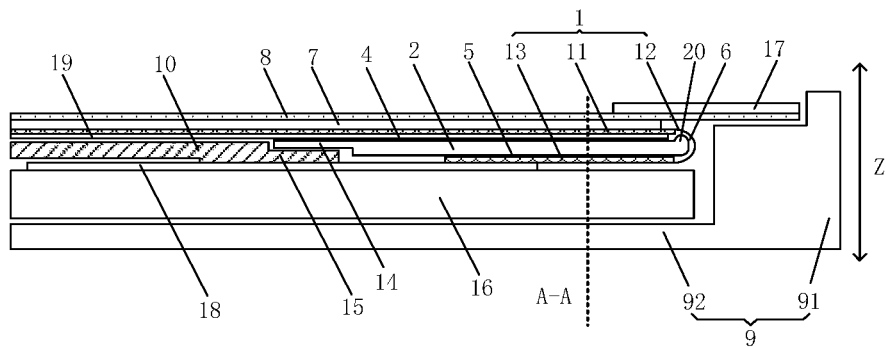
FIG. 5 is a schematic structural view of a flexible display device according to an embodiment of the present disclosure.

In some embodiments, the flexible display device further includes a protruding structure of cover plate 17 located on an edge of the cover plate 8 close to the side structure 91. Part of the protruding structure of cover plate 17 is located above the side structure 91, and the remaining part of the protruding structure of cover plate 17 is located above a peripheral region outside an effective display area (Area A-A) of the flexible display panel 1. The protruding structure of cover plate 17 extends from an edge of the effective display area by a certain safe distance to reach an edge of the cover plate 8. Referring to FIG. 5, an edge of the protruding structure of cover plate 17 is located at a position which keeps a distance of 0.3 mm to 1 mm from the effective display area towards the edge of the cover plate. In some embodiments, an end of the protruding structure of cover plate 17 on a side of the effective display area has a gradually reducing thickness, so as to minimize an influence on touch performance of the flexible display device and improve the appearance thereof. The protruding structure of cover plate 17 may enhance strength of the cover plate 8, so as to protect the flexible display panel 1. When there is an external force, one end of the protruding structure of cover plate 17 is supported by the flexible display panel 1, the touch module 7 and the cover plate 8, the other end thereof is supported by the side structure 91 of the second housing 9, and the protruding structure of cover plate 17 is thicker, so that deformation of the cover plate 8 above the bending region 12 is reduced, thereby further improving deformation of the bending region 12.

In some embodiments, the protruding structure of cover plate 17 is integrally formed with the cover plate 8 as a single piece; in some embodiments, the protruding structure of cover plate 17 is formed by connecting a plate or a molded part with the cover plate 8, and is disposed on the cover plate 8 with adhesive or glue, or by means of molding. A material of the protruding structure of cover plate 17 is plastic or metal. A shape of the protruding structure of cover plate 17 may be set as required.

In some embodiments, the flexible display device further includes a buffer layer 19 located on a side of the main structure region 11 close to the extension region 13. The buffer layer 19 plays a role in supporting the flexible display panel 1. Illustratively, a material of the buffer layer 19 is foam.

In the technical solutions of the flexible display device provided by the embodiments, the flexible display panel includes the main structure region, the bending region and the extension region, and the bending region is bent so as to locate the extension region at the back of the main structure region, an accommodation space is formed between the main structure region, the extension region and the bending region, and the support structure is located in the accommodation space, and can provide support in the accommodation space, so as to eliminate influences of depressions of different degrees of the cover plate on the bending region during pressing processes.

FIG. 5 is a schematic structural view of a flexible display device according to embodiments of the present disclosure. As shown in FIG. 5, in some embodiments, a protruding support structure 20 is integrally provided at the end of the support structure 2 close to the bending region 12, the protruding support structure 20 is located in the bending region 12 and protrudes toward the main structure region 11 of the flexible display panel 1, and the gap 6 is provided between the protruding support structure 20 and the bending region 12. By providing the protruding support structure 20 on a side of the support structure 2, space utilization may be improved to increase the support of the bending region 12, thereby further improving deformation of the bending region 12. In some embodiments, when the support structure 2 is made of metal, the protruding support structure 20 is integrally formed by means of numerical control machining. In some embodiments, when the support structure 2 is made of plastic, rubber, etc., the protruding support structure 20 is integrally formed by means of injection molding. The protruding support structure 20 is formed into a round corner structure to avoid scratching the bending region 12.

As for other structures of the flexible display device in the embodiments, please refer to the description of the foregoing embodiments, which will not be repeated here.

In the technical solutions of the flexible display device provided by the embodiments, the flexible display panel includes the main structure region, the bending region and the extension region, and the bending region is bent so as to locate the extension region at the back of the main structure region, an accommodation space is formed between the main structure region, the extension region and the bending region, and the support structure is located in the accommodation space, and can provide support in the accommodation space, so as to eliminate influences of depressions of different degrees of a cover plate on a bending region during pressing processes.

Figure 6:
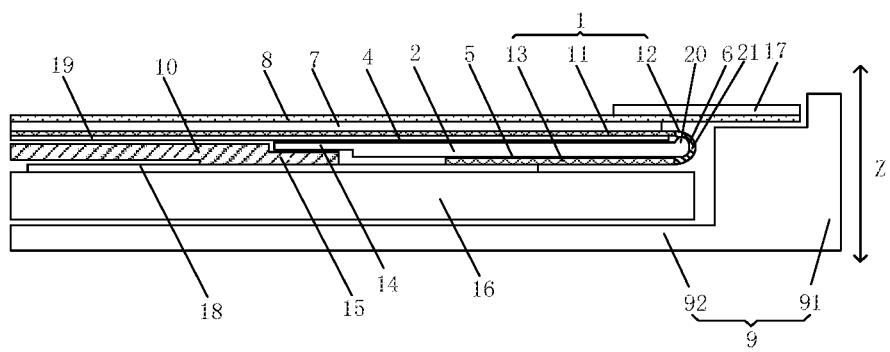
FIG. 6 is a schematic structural view of a flexible display device according to an embodiment of the present disclosure.

FIG. 6 is a schematic structural view of a flexible display device according to embodiments of the present disclosure. In some embodiments, a filling structure 21 is disposed in the gap 6.

Illustratively, a material of the filling structure 21 is rubber. In practical applications, the filling structure 21 may be made of any other elastic material, which is not listed here.

In some embodiments, the filling structure 21 is combined with the support structure 2 by an insert-molding process. Specifically, the support structure 2 is placed in an injection mold in advance and fixed, and then a material of the filling structure is injected.

In some embodiments, by disposing the filling structure 21 in the gap 6, space utilization may be improved to increase the support of the bending region 12, thereby further improving deformation of the bending region 12. Since the rubber is soft, interference setting can be appropriately performed.

In the technical solutions of the flexible display device provided by the embodiments, the flexible display panel includes the main structure region, the bending region and the extension region, and the bending region is bent so as to locate the extension region at the back of the main structure region, an accommodation space is formed between the main structure region, the extension region and the bending region, and the support structure is located in the accommodation space, and can provide support in the accommodation space, so as to eliminate influences of depressions of different degrees of a cover plate on a bending region during pressing processes.

It should be understood that, the above embodiments are merely exemplary embodiments which are employed to illustrate the principle of the present disclosure, but the present disclosure is not limited thereto. Various changes and modifications can be made by those skilled in the art without departing from the spirit and essence of the present disclosure, and should be considered to fall within the protection scope of the present disclosure.

What is claimed is:

1. A flexible display device, comprising a flexible display panel and a support structure,
wherein the flexible display panel comprises a main structure region, a bending region and an extension region, the bending region is bent to locate the extension region at a back of the main structure region, an accommodation space is formed between the main structure region, the extension region and the bending region, at least part of the support structure is located in the accommodation space, and one end of the support structure extends into a bending space surrounded by the bending region.

2. The flexible display device of claim 1, wherein the support structure is a plate-like structure.

3. The flexible display device of claim 2, wherein the end of the support structure extending into the bending space has a round corner structure.

4. The flexible display device of claim 2, wherein the support structure is a folded two-layer metal plate, a folded region of two layers of metal plate of the folded two-layer metal plate forms a round corner close to the bending region of the flexible display panel, a welding seam is formed between the two layers of metal plate, and one layer of metal plate close to the main structure region of the flexible display panel extends away from the bending region and beyond the other layer of metal plate close to the extension region of the flexible display panel.

5. The flexible display device of claim 4, wherein a protruding support structure is integrally provided at the end of the support structure close to the bending region as a single piece, the protruding support structure is located in the bending space surrounded by the bending region and protrudes toward the main structure region, and a gap is formed between the protruding support structure and the bending region.

6. The flexible display device of claim 5, wherein a filling structure is disposed in the gap, and a material of the filling structure is rubber.

7. The flexible display device of claim 5, wherein the support structure is connected with the main structure region of the flexible display panel with an adhesive, and is connected with the extension region of the flexible display panel with an adhesive.

8. The flexible display device of claim 7, wherein the adhesive is a double-sided tape.

9. The flexible display device of claim 8, further comprising a first housing keeping an empty space in the extension region and the bending region, wherein the one layer of metal plate of the support structure close to the main structure region of the flexible display panel extends away from the bending region and beyond the other layer of metal plate close to the extension region of the flexible display panel, and the part of the one layer of metal plate, which is beyond the other layer of the metal plate, extends to the first housing and is overlapped with the first housing.

10. The flexible display device of claim 2, further comprising a first housing keeping an empty space in the extension region and the bending region, wherein one end of the support structure away from the bending region is provided with a first overlapping structure, one end of the first housing close to the support structure is provided with a second overlapping structure matched with the first overlapping structure, and the first overlapping structure and the second overlapping structure are overlapped along a direction perpendicular to the flexible display panel.

11. The flexible display device of claim 10, wherein the first overlapping structure is integrated with the support structure as a single piece, the second overlapping structure is integrated with the first housing as a single piece, both the first and second overlapping structures have reduced thicknesses in a direction perpendicular to the flexible display panel, an upper surface of the first overlapping structure facing the main structure region of the flexible display panel is flush with an upper surface of the support structure facing the main structure region of the flexible display panel and an upper surface of the first housing facing the main structure region of the flexible display panel, and a lower surface of the second overlapping structure away from the main structure region of the flexible display panel is flush with a lower surface of the extension region of the flexible display panel away from the support structure.

12. The flexible display device of claim 11, further comprising a touch module, a cover plate, and a second housing, wherein the touch module is located on a side of the main structure region of the flexible display panel away from the extension region, the second housing includes a side structure and a main structure, the side structure is located on an outer side of the flexible display panel, the main structure of the second housing is located on one side of the flexible display panel close to the extension region and surrounds the first housing, the cover plate is located on one side of the touch module away from the main structure region, and an outer side of the cover plate is located above the side structure of the second housing.

13. The flexible display device of claim 12, further comprising a protruding structure of cover plate located on an edge of the cover plate close to the side structure, wherein one end of the protruding structure of cover plate is located at a position which keeps a distance of 0.3 mm to 1 mm from an effective display area of the flexible display panel towards the edge of the cover plate, and the other end of the protruding structure of cover plate is located on the outer side of the cover plate above the side structure of the second housing.

14. The flexible display device of claim 12, further comprising an external circuit located between the extension region and the main structure of the second housing.

15. The flexible display device of claim 14, wherein the external circuit comprises a flexible printed circuit board disposed in the extension region and extending to one side of the first housing close to the second housing.

16. The flexible display device of claim 15, further comprising a buffer layer located between the main structure region and the support structure and between the main structure region and the first housing.

17. The flexible display device of claim 16, wherein a gap is formed between the support structure and the bending region, and a filing structure is provided in the gap.

18. The flexible display device of claim 17, wherein a material of the filling structure is rubber.

19. The flexible display device of claim 18, further comprising a protruding structure of cover plate, wherein,
the protruding structure of cover plate is located on an edge of the cover plate close to the side structure, one end of the protruding structure of cover plate is located at a position which keeps a distance of 0.3 mm to 1 mm from an effective display area of the flexible display panel towards the edge of the cover plate, and the other end of the protruding structure of cover plate is located on the outer side of the cover plate above the side structure of the second housing.

20. The flexible display device of claim 19, wherein the first housing is located at a back of the main structure region and at the end of the support structure away from the bending region.

* * * * *